(12) United States Patent
Schauwecker et al.

(10) Patent No.: US 12,379,436 B2
(45) Date of Patent: Aug. 5, 2025

(54) ACTIVE REDUCTION OF TEMPERATURE INDUCED SHIM DRIFT IN NMR MAGNET SYSTEMS

(71) Applicant: Bruker Switzerland AG, Fällanden (CH)

(72) Inventors: Robert Schauwecker, Zürich (CH); Pierre-Alain Bovier, Zürich (CH); Michele Zaffalon, Zürich (CH); Nicolas Freytag, Binz (CH); Roger Meister, Hinteregg (CH)

( * ) Notice: Subject to any disclaimer, the term of this patent is extended or adjusted under 35 U.S.C. 154(b) by 201 days.

(21) Appl. No.: 18/355,534

(22) Filed: Jul. 20, 2023

(65) Prior Publication Data

US 2024/0133985 A1   Apr. 25, 2024
US 2024/0230807 A9   Jul. 11, 2024

(30) Foreign Application Priority Data

Jul. 21, 2022   (DE) .................. 10 2022 207 489

(51) Int. Cl.
  *G01R 33/38*   (2006.01)
  *G01L 1/24*    (2006.01)
  *G01R 33/387*  (2006.01)

(52) U.S. Cl.
  CPC ............ *G01R 33/3804* (2013.01); *G01L 1/24* (2013.01); *G01R 33/387* (2013.01)

(58) Field of Classification Search
  CPC ............ G01R 33/3804; G01R 33/387; G01R 33/3802; G01L 1/24; H01F 6/04
  See application file for complete search history.

(56) References Cited

U.S. PATENT DOCUMENTS 4,300,354 A   11/1981   Buchs et al.
5,404,726 A   4/1995    Janssen
(Continued)

FOREIGN PATENT DOCUMENTS

DE   102015225731 B3   4/2017
DE   10104365 C1       8/2022
(Continued)

OTHER PUBLICATIONS

Agilent 400-MR DD2 NMR Spectrometer—Site Preparation Checklist, issued Sep. 11, 2013; Revision B; Agilent Technologies.
(Continued)

*Primary Examiner* — G. M. A Hyder
(74) *Attorney, Agent, or Firm* — Benoît & Côté, Inc.

(57) ABSTRACT

An NMR apparatus having a magnet coil system for generating a homogeneous magnetic field comprises a superconducting magnet arranged within a vacuum vessel in the cold region of a cryostat, and a shim system containing shim elements arranged outside the vacuum vessel. The superconducting magnet has a first mechanical connection point to the vacuum vessel via a magnet suspension, and the shim system has a second mechanical connection point to the vacuum vessel via a positioning element. On at least one portion of a path along the vacuum vessel from the first connection point to the second connection point and/or on at least one portion of a path along the positioning element from the second connection point to the shim system, a regulating element for regulating thermally caused changes in length is arranged on the relevant path. Magnetic field homogeneity can thus be kept largely stable.

20 Claims, 5 Drawing Sheets

(56) References Cited

U.S. PATENT DOCUMENTS

| | | | |
|---|---|---|---|
| 5,744,959 | A | 4/1998 | Jeker et al. |
| 6,825,663 | B2 | 11/2004 | Bechtold |
| 7,330,029 | B2 | 2/2008 | Mraz et al. |
| 9,766,312 | B2 | 9/2017 | Grossniklaus et al. |
| 2005/0174118 | A1 | 8/2005 | Kasten et al. |
| 2008/0088311 | A1 | 4/2008 | Nakabayashi et al. |
| 2020/0411218 | A1* | 12/2020 | Bovier .................. F17C 13/007 |

FOREIGN PATENT DOCUMENTS

| | | |
|---|---|---|
| EP | 0014250 A1 | 8/1980 |
| EP | 0586947 A1 | 3/1994 |
| EP | 0780698 B1 | 7/2002 |
| EP | 1340994 A1 | 9/2003 |
| EP | 1705419 A2 | 9/2006 |
| EP | 2015092 A1 | 1/2009 |
| EP | 3686620 | 7/2020 |
| JP | 2017113411 A | 6/2017 |

OTHER PUBLICATIONS

Daniel Baumann and Stanley J. Niles, Bruker Site Planning Manual, 2011, version 006.

"Acyclic Acids—Advances in Research and Application: 2013, Edition: ScholarlyBrief", Q. Ashton Acton, PhD, Scholarly Editions, 2013, p. 139.

"Modern Instrumental Analysis", Satinder Ahuja, Neil Jespersen, Elsevier, 2006, p. 270.

* cited by examiner

ACTIVE REDUCTION OF TEMPERATURE INDUCED SHIM DRIFT IN NMR MAGNET SYSTEMS

The invention relates to an NMR apparatus having a magnet coil system for generating a homogeneous magnetic field, which comprises a superconducting magnet arranged within a vacuum vessel in the cold region of a cryostat, and which comprises a shim system containing shim elements arranged outside the vacuum vessel, wherein the superconducting magnet has a first mechanical connection point to the vacuum vessel via a magnet suspension, and wherein the shim system has a second mechanical connection point to the vacuum vessel via a positioning element.

Such an NMR apparatus is known from patent publication DE 101 04 365 C1.

BACKGROUND OF THE INVENTION

The present invention relates quite generally to the field of nuclear magnetic resonance (NMR), and in particular to cooled NMR magnet systems that are generally superconducting during operation and in which the homogeneity of the NMR magnetic field is further improved by a shim system.

NMR spectroscopy is a widely used and powerful method in instrumental analysis, with the aid of which the electronic environment of individual atoms and the interaction of the individual atoms with the adjacent atoms can be examined in a substance to be analyzed, such as a hydrocarbon or a bio-inorganic complex compound. In this way, for example, the composition, structure and dynamics of the substance to be analyzed can be made clear, and the concentration of the substance to be analyzed can likewise be determined.

In an NMR measurement, the substance is exposed to a strong static, homogeneous magnetic field $B_0$, which aligns the nuclear spins in the substance. High-frequency electromagnetic pulses are then radiated into the substance to be analyzed. The high-frequency electromagnetic fields generated in this way are detected in the NMR spectrometer. Information about the properties of the analyzed substance can then be obtained from this.

Both in high-resolution magnetic resonance spectroscopy and in magnetic resonance imaging, the requirements for magnetic field homogeneity are very high. In order to achieve the homogeneity specifications, electrical cryoshims are frequently used. Their coils generate elementary field profiles. Provided with suitable currents, they can improve the homogeneity of the NMR magnet at the sample position.

Sometimes, cold ferromagnetic material (for example, iron alloys or steel alloys) is also used as a shim element for improving homogeneity, as described, for example, in patent publication DE 10 2015 225 731 B3. Regardless of how a magnet is cold-shimmed, a residual inhomogeneity remains at the end and must be corrected by means of a further shim system, which comprises shim elements arranged outside the vacuum vessel, typically in the magnet bore (referred to below as room temperature shims or "RT shims"). These RT shims, like the cryoshims, can comprise either shim coils which are supplied with current by RT shim currents, or ferromagnetic material or a combination of the two. Although the name, "room-temperature shims," suggests that these shims are at an ambient temperature, this is not necessarily the case: The power dissipated in the shim coils often causes their temperature to be slightly increased compared to the ambient temperature. In addition, NMR experiments with sample substances are also sometimes carried out at variable temperatures.

The superconducting magnet is mechanically connected to the RT shims via a long path. A first part of this path extends in the cold region of the cryostat and is temperature-stabilized by the cryostat. A second part is exposed to the ambient temperature and its fluctuations. A third part is subject to both fluctuations in the ambient temperature and temperature fluctuations due to the operation of the arrangement. The second and third parts of the path change their length due to their thermal expansion when the temperature changes. Consequently, a relative movement between the superconducting magnet and the RT shims occurs. The currents in the RT shims and/or the RT ferroshims are then no longer ideally matched for compensating for the field homogeneity, and the quality of the magnetic resonance images or magnetic resonance spectra deteriorates.

If the RT shims comprise coils or coil systems, their currents can be adjusted, and the original field homogeneity can thus be restored. In this case, the deterioration of the field homogeneity due to temperature-induced relative movements between the superconducting magnet and the RT shims therefore manifests as a "drift" of the required RT shim currents.

Although sensitive devices are often operated in air-conditioned rooms, temperature fluctuations of 1° C. during the day are nevertheless not uncommon. In many applications, the RT shim currents can be adjusted automatically. If this is not possible, the homogeneity fluctuations during the measurement can be disruptive.

Comparable homogeneity fluctuations occur when the temperature, e.g., in the magnet bore, varies over time for other reasons. Such a situation occurs, for example, when the NMR test sample is changed, and shimming must be performed again. The power dissipated by the RT shims may differ from the previous RT shim power and cause new temperature conditions in the magnet bore. It then takes a certain amount of time until the temperature evens out to the new level. During this time, the shim currents must be adjusted again and again. A similar problem occurs when the temperature of the NMR test sample is changed.

Furthermore, fluctuations in the ambient temperature influence the temperature of the compressed gas that drives a turbine with the NMR test sample. Moreover, the dissipation during operation of NMR/MRI probeheads or gradient coils should also be taken into account.

An obvious solution to the problem can in a first approximation consist in keeping the fluctuations of the ambient temperature as small as possible. The larger the laboratory, the more expensive and more complicated it is to operate an air conditioner with sufficient precision.

In a second, refined approach, the shim currents can be automatically adapted to the fluctuating homogeneity. However, this is possible only if a lock substance is available, which is not the case, for example, in solid-state NMR experiments.

A high-resolution NMR spectrometer with a superconducting NMR magnet coil system, which is cooled to cryogenic temperatures with a pulse tube refrigerator and which is arranged within a vacuum vessel in the cold region of a cryostat, is described in patent publication EP 0 780 698 B1.

Patent publication EP 2 015 092 A1 addresses the problem of the shim drift due to atmospheric pressure fluctuations. Similarly as with temperature fluctuations, a relative movement between the RT shims and the superconducting magnet occurs. In order to minimize the relative movement, a bridge is used, which is fixed to the outer edge of the cryostat and thus does not follow the movement of the central region of the cryostat during pressure fluctuations. The RT shim system is fastened to this bridge.

Quantitative clinical NMR analysis instruments with automatic compensation for temperature sensitivity over a wide temperature range are described in patent publication EP 3 686 620 A1.

The publication, "Acyclic Acids—Advances in Research and Application: 2013 Edition: ScholarlyBrief," Q. Ashton Acton, PhD, ScholarlyEditions, 2013, p 139, likewise discusses the temperature sensitivity of the electronics in NMR analyzers. Temperature control of the electronics can accordingly provide a remedy.

The publication, "Modern Instrumental Analysis," Satinder Ahuja, Neil Jespersen, Elsevier, 2006, p 270, points to the temperature sensitivity of the sample substance. By means of temperature regulation at the location of the substance, this effect can be counteracted.

Patent publication DE 10 2015 225 731 B3 cited above discloses a helium-cooled, superconducting magnet coil system in an NMR apparatus with an easily accessible, likewise low-temperature-cooled NMR shim arrangement. The NMR apparatus has a field shaping device between a helium vessel inner tube and a radiation shield inner tube, which device is in rigid mechanical contact with the helium vessel, without touching the radiation shield inner tube.

Patent publication DE 101 04 365 C1 likewise cited above discloses an NMR apparatus which is generic with respect to the present invention, with all feature complexes defined at the outset, including the shim system of the generic type. However, the problems described above about fluctuations in the magnetic field homogeneity due to usual laboratory temperature changes exist in this apparatus as well.

SUMMARY OF THE INVENTION

In contrast, the present invention is based upon the modifying an NMR apparatus with the features defined at the outset with the aid of particularly simple, easily accessible technical means and as cost-effectively as possible, such that the magnetic field homogeneity is kept largely stable and constant within and in the surroundings of the apparatus even in changing temperature conditions.

This is achieved by the present invention surprisingly simply and effectively in that, on a portion of a path along the vacuum vessel from the first mechanical connection point to the second mechanical connection point and/or on a portion of a path along the positioning element from the second mechanical connection point to the shim system, a regulating element for adjusting the strain of the vacuum vessel and/or of the positioning element along the path portion is arranged.

The use of the regulating element provided according to the invention minimizes the change in the strain in a portion of a path along the vacuum vessel and/or along the positioning element of the shim system at variable ambient or system temperature so that the relative movement between the superconducting magnet and the shim system is kept small. As a result, field homogeneity remains stable.

Regulating elements can be designed as mechanical actuators or as heating or cooling elements and be attached to the path at different locations.

Piezoelectric elements, for example, can be used as mechanical actuators. Electric resistance heaters can be used as heating elements. Thermoelectric coolers (TEC) can be used as cooling elements.

The regions with heating or cooling elements are artificially kept hotter or colder than the ambient temperature. So that not too much heating or cooling capacity is lost, it is recommended to thermally insulate the corresponding regions from the environment.

It is also possible to keep constant the temperature in a portion of a path along the vacuum vessel and/or along the positioning element of the shim system by means of temperature-controlled gases. This solution is preferably used for temperature stabilization within the magnet bore.

Furthermore, the temperature in a portion of a path along the vacuum vessel and/or along the positioning element of the shim system can be stabilized by thermal conduction elements, for example based on heat pipes in combination with heaters and/or TECs. Thermal conduction elements reduce temperature gradients on the path and therefore reduce the required number of regulating elements.

If, in addition to the regulating elements, a sensor element for measuring the strain and/or the temperature of the vacuum vessel and/or of the positioning element is used, a control loop for stabilizing the strain and/or the temperature of the vacuum vessel and/or of the positioning element can be operated with the aid of an electronic control unit, whereby the aim of a temporally stable field homogeneity at variable ambient or system temperature is best achieved.

In an exemplary class of embodiments of the NMR apparatus according to the invention, the regulating element comprises a temperature control element and/or a heat exchanger for transferring heat to or from a temperature-controlled fluid.

Temperature changes result in strain changes of a vacuum vessel and/or of a positioning element. By regulating the temperature of these components, the temperature-induced strain changes can be causally counteracted. As a result, the relative movement between the superconducting magnet and the shim system is minimized, and field homogeneity remains stable.

In those embodiments in which the regulating element comprises a heat exchanger, a temperature-controlled fluid flows on a portion of the path along the vacuum vessel from the first mechanical connection point to the second mechanical connection point and/or on a portion of the path along the positioning element from the second mechanical connection point to the shim system.

This embodiment is particularly suitable for uncontrolled temperature stabilization of the components concerned. Thus, no monitoring of the temperature of the components is necessary. The fluid may be a gas or a liquid.

In certain developments of this class of embodiments, the temperature control element is designed as a heating element, preferably as an electrical resistance heater, and/or the temperature control element is designed as a cooling element, in particular as a thermoelectric cooler.

In comparison to a temperature regulation by means of a temperature-controlled fluid, heating or cooling elements represent an instrumental simplification.

Thermoelectric coolers, also called Peltier elements, are electrothermal transducers which generate a temperature difference based on the Peltier effect when current flows. They can be used both for cooling and for heating. With a suitable choice of the current, the heating or cooling capacity can be adjusted such that the temperature remains stable.

Also advantageous are embodiments of the invention in which the regulating element comprises at least one, preferably mechanical, actuator, in particular a motor and/or a piezo element, by means of which the strain of the vacuum vessel and/or of the positioning element along the path portion and/or the position of the positioning element relative to the vacuum vessel can be adjusted.

If temperature-induced strain changes are mechanically compensated, then temperature regulation of the components concerned can be dispensed with. Mechanical regulating elements can represent an instrumental simplification over thermal regulating elements, and they can regulate the strain or positioning of the components concerned more precisely and with a shorter time delay.

In particular, it can be provided in these embodiments that the regulating element comprises at least one piezo element by means of which a change in position or strain of a path portion can be corrected.

The piezo element can be integrated in the positioning element, for example. By applying an electrical voltage, its length can be adapted such that the overall length of the positioning element remains constant over time.

Another class of embodiments of the invention is characterized in that, on a portion of a path along the vacuum vessel from the first mechanical connection point to the second mechanical connection point and/or on a portion of a path along the positioning element from the second mechanical connection point to the shim system, a sensor element for measuring the strain and/or the temperature of the vacuum vessel and/or of the positioning element along the path portion is arranged, which sensor element preferably comprises a thermometer, in particular a PT-100 sensor, and/or a strain measuring element.

The sensor element can be used to not only control but also operate, in a controlled manner, a regulating element. In particular, mechanical actuators for compensating for a temperature-induced change in the strain of a component may be controlled by a mechanical sensor. Thermal regulating elements may be controlled by measuring the component temperature to be stabilized. In both cases, the relative movement between the superconducting magnet and the shim system can be kept small. As a result, field homogeneity remains stable.

As a thermal sensor element, platinum resistance thermometers (typically PT-100) are particularly suitable, because they enable accurate temperature measurements in the range of the room temperature.

If the sensor element comprises a strain measuring element, a resistance sensor, preferably a strain gauge, or an optical strain sensor, preferably a fiber Bragg grating sensor, or a laser, with which a change in the strain of an observed path portion can be detected by means of an electro-optical distance measurement, in particular interferometrically, are in particular advantageous.

A strain measuring element can, for example, measure the change in length of the positioning element or of a suspension turret and transmit it as a control variable to a control loop for stabilizing the strain of this component.

In further preferred developments of this class of embodiments, the regulating element is arranged at a location on a portion of a path along the vacuum vessel from the first mechanical connection point to the second mechanical connection point and/or at a location on a portion of a path along the positioning element from the second mechanical connection point to the shim system, and the sensor element is arranged at a different location of the same or another path portion.

If the temperature or strain change measured on a component does not have to be compensated for on the same component, regulating elements can be saved. For example, a single mechanical actuator can be attached to the positioning element and compensates for the cumulative, measured change in the strain of the suspension turret and of the positioning element.

In further advantageous embodiments of the invention, a thermal insulation which thermally decouples the regulating element from the environment is attached to a portion of a path along the vacuum vessel from the first mechanical connection point to the second mechanical connection point and/or to a portion of a path along the positioning element from the second mechanical connection point to the shim system.

Thermal insulation is a passive measure for stabilizing the temperature of the positioning element or of a component of the vacuum vessel, in particular of the suspension turrets. This supports the active stabilizing measures according to the present invention and increases their efficiency.

Likewise advantageous are embodiments of the invention in which the vacuum vessel has a vertical room-temperature bore in which the shim system is arranged, and in which the positioning element comprises a clamping ring, wherein the contact surface of the clamping ring forms the second mechanical connection point on the upper end of the room-temperature bore of the vacuum vessel.

In the case of vertical orientation of the room-temperature bore, temperature changes lead to a vertical displacement of the shim system relative to the magnet coil system. The effect of a temperature-induced strain of the vacuum vessel on the field homogeneity is thus proportional to the vertical distance between the first and second mechanical connection points. When the positioning element is attached with a clamping ring to the upper end of the room-temperature bore, this vertical distance is reduced approximately to the height of the suspension turrets, which typically only makes up a fraction of the total height of the vacuum vessel.

Particularly advantageous are also embodiments of the invention in which materials with different thermal expansion coefficients whose thermal expansions mutually compensate for one another are used in portions on the path along the vacuum vessel from the first mechanical connection point to the second mechanical connection point and/or on the path along the positioning element from the second mechanical connection point to the shim system.

Thus, only significantly lower absolute thermal expansions remain, which can finally also be minimized in the context of a fine adjustment with the aid of the invention.

In another embodiment of the NMR apparatus according to the invention, only materials whose thermal expansion coefficient at operating temperature is less than 5 ppm/K are used on at least one portion of a path along the vacuum vessel from the first mechanical connection point to the second mechanical connection point and/or on at least one portion of a path along the positioning element from the second mechanical connection point to the shim system.

Typical metals have thermal expansion coefficients around 20 ppm/K. If a material with a significantly lower thermal expansion coefficient is used, temperature fluctuations have a lesser effect on the relative movement between the superconducting magnet and the shim system. A metal with a thermal expansion coefficient of about 2 ppm/K is, for example, Invar. Invar is suitable as material for the vacuum vessel because it can be welded in a vacuum-tight manner. In this respect, it should be considered that Invar gets magnetized by the background field of the superconducting magnet. Since Invar is only located in a small stray field region of the superconducting magnet, no disadvantages are to be expected, at least in the case of actively shielded magnets. The forces and the interference field of the magnetization are in any case small.

In the case of non-metals, carbon-fiber-reinforced plastic (CFRP) is, for example, characterized by a thermal expansion coefficient of less than 1 ppm/K in the fiber direction. This material is in particular suitable for the positioning element. Because the thermal expansion of CFRP or similar materials is less than the thermal expansion of all metals, including Invar, it is expedient to use such materials on a largest possible proportion of the connection length between the shim system and the first mechanical connection point. For this purpose, the positioning element can be extended with a CFRP scaffold to the suspension turrets and fixed thereto. In such an arrangement, the first and second mechanical connection points approximately coincide, as a result of which temperature-induced changes in the strain of the vacuum vessel hardly cause any displacement of the shim system relative to the superconducting magnet and become insignificant for the stability of the field homogeneity.

In a further class of embodiments of the NMR apparatus according to the invention, the superconducting magnet is arranged within the vacuum vessel in a helium vessel of the cryostat that is filled with liquid helium during operation, wherein the helium vessel is preferably surrounded radially by a nitrogen vessel of the cryostat that is filled with liquid nitrogen.

In order to minimize the heat conduction into the helium vessel, the latter is fastened not directly to the casing or cover of the vacuum vessel but via a magnet suspension by means of the first mechanical connection point to a turret-like extension of the vacuum vessel (suspension turret). As a result of this useful extension of the path from the first mechanical connection point to the helium vessel, however, the path along the vacuum vessel from the first to the second mechanical connection point is also extended. Consequently, temperature-induced changes in the strain of the vacuum vessel in such systems result in particularly large displacements of the shim system relative to the superconducting magnet and in particularly large disturbances of the field homogeneity. The inventive measures for the active reduction of the temperature-induced shim drift are therefore particularly advantageous in NMR magnet systems of this type.

Nevertheless, the inventive measures are also useful in NMR magnet systems that do not have a helium vessel and in which the superconducting magnet is cooled to its operating temperature by means of a cryocooler.

The scope of the present invention also includes a method for operating an NMR apparatus that is modified according to the invention with a sensor element and is characterized in that, on a portion of a path along the vacuum vessel from the first mechanical connection point to the second mechanical connection point and/or on a portion of a path along the positioning element from the second mechanical connection point to the shim system, the temperature and/or the strain of the vacuum vessel and/or of the positioning element along the path portion is measured by means of a sensor element and is stabilized over time by an electronic control unit by actuating a regulating element.

The expedient operation of such an arrangement according to the invention is based on a control task. On the basis of the measured values of a sensor element (control variable), a set value (manipulated variable) for a regulating element is to be determined so that a specific parameter (controlled variable) does not leave a defined value range. In various embodiments according to the invention, the temperature and/or the strain of the vacuum vessel and/or of the positioning element can serve both as a control variable and as a controlled variable. The manipulated variable depends on the regulating element. For example, it may be a current intensity for a heating element or an electrical voltage for a piezo element. An operating method which uses an electronic control unit, in particular a PID controller, for processing the control variable and for determining and outputting the manipulated variable is advantageous because such controllers are particularly well suited to achieving comparable control tasks.

A further advantageous method variant provides that a temperature or strain change at a location of a path portion is detected by means of a sensor element and that this temperature or strain change is counteracted with the aid of the control unit by actuating a regulating element positioned at another location of the same or another path portion.

This operating method makes it possible, for example, to use a temperature measurement on a suspension turret as a control variable and the strain of a mechanical actuator on the positioning element as a controlled variable. This additional flexibility makes it possible to find an embodiment optimally adapted to each task for the sensor element and for the regulating element independently of one another.

A method variant of the invention is characterized in that, on a portion of a path along the vacuum vessel from the first mechanical connection point to the second mechanical connection point and/or on a portion of a path along the positioning element from the second mechanical connection point to the shim system, the temperature and/or the strain of the vacuum vessel and/or of the positioning element along the path portion is measured by means of a sensor element, and that the currents through the shim elements of the shim system are adapted by an electronic control unit in such a way that the homogeneity change due to the measured temperature and/or strain changes is counteracted so that the field homogeneity is stabilized over time.

In this method, instead of the temperature and/or the strain of the vacuum vessel and/or the positioning element, the field homogeneity is treated as a controlled variable, which is to be stabilized over time. Accordingly, the control unit does not actuate or not only actuate the regulating elements described above (which, after all, only indirectly influence the temporal stabilization of the field homogeneity), but rather the shim elements (coils) of an electrical shim system. The manipulated variables are accordingly the currents of the individual shim elements. However, the measured values of a sensor element according to the invention are still to be used as control variable because measurements of the field homogeneity as a control variable are not always available in a sufficiently short temporal sequence. The use of the shim system for controlled temporal stabilization of the field homogeneity represents a technical simplification over the use of additional regulating elements because a shim system is usually present in an NMR apparatus anyway. In addition, a shim system responds without delay and with high precision. The small shim current adaptations also hardly lead to a change in the dissipated power in the shim system, so that the temperature thereof remains stable when this method is applied, and undesired feedback effects do not happen.

Further advantages of the invention are found in the description and the drawing. Likewise, the features mentioned above and those detailed below can be used according to the invention individually or collectively in any combination. The embodiments shown and described are not to be understood as an exhaustive list, but rather have an exemplary character for the description of the invention.

BRIEF DESCRIPTION OF THE DRAWINGS

The invention is illustrated in the drawings and will be explained in more detail with reference to embodiments. In the drawings.

DETAILED DESCRIPTION

Figure 1:
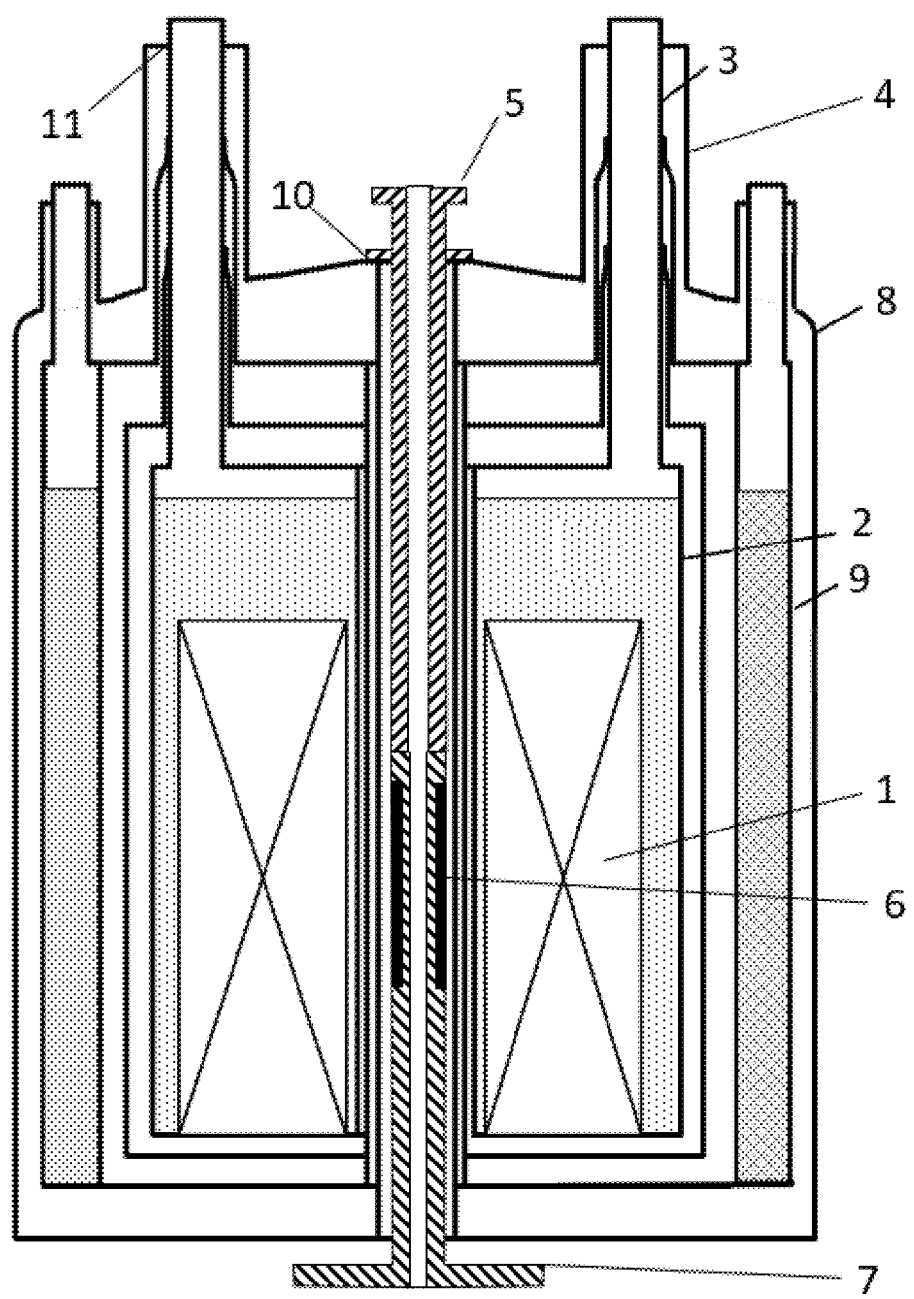
FIG. 1 is a schematic, vertical sectional view of an embodiment of the NMR apparatus according to the invention in which the positioning element comprises a clamping ring, wherein the contact surface of the clamping ring forms the second mechanical connection point on the upper end of the room-temperature bore of the vacuum vessel.

In general, the present invention relates to a modified NMR apparatus with a magnet coil system for generating a homogeneous magnetic field, which comprises a superconducting magnet 1 arranged within a vacuum vessel 8 in the cold region of a cryostat, as shown in FIGS. 1-3 and 6. In addition, the NMR apparatus comprises a shim system 7, which contains shim elements 6 that are arranged outside the vacuum vessel 8 and can be designed as electrical coils and/or as ferromagnetic elements. The superconducting magnet 1 also has a first mechanical connection point 11 to the vacuum vessel 8 via a magnet suspension 3, wherein the magnet suspension 3 in turn is arranged in a suspension turret 4. The shim system 7 has a second mechanical connection point 10; 12 to the vacuum vessel 8 via a positioning element 5.

In addition to the shim elements 6, the shim system 7 typically also comprises a holding structure of the shim elements 6, so that the shim system 7 forms a unit, not just functionally, but also structurally. The holding structure makes it possible to mechanically connect the entirety of the shim elements 6 to a positioning element 5, or it serves to guide electrical lines to the shim elements 6, or as a mechanical interface to an NMR probehead. The conceptual distinction between positioning element 5 and other structural components, e.g., a holding structure of the shim elements 6, is given in that all structural components in a path between a second mechanical connection point 10; 12 to the vacuum vessel 8 on the one side and at least one shim element 6 on the other side are to be understood as positioning elements 5 when their strain influences the position or orientation of this shim element 6 relative to the superconducting magnet 1. FIG. 1 shows a particularly advantageous, two-part mechanical structure for the arrangement of shim elements 6 in a magnet bore. The upper part of the mechanical structure establishes the connecting path from the shim system 7 to the second mechanical connection point 10 between the clamping ring and the vacuum vessel 8, and serves by definition as a positioning element 5. The lower part of the mechanical structure is assigned to the shim system 7 and serves to hold the entirety of the shim elements 6, so as to introduce the shim elements 6 from below into the magnet bore, to receive an NMR probehead, and to guide electrical supply lines to the shim elements 6. The two-part design of the mechanical structure for the arrangement of the shim elements 6 simplifies the installation in the magnet bore. In the operating state, the two structures are mechanically connected by screws, for example. In contrast, one-piece structures, in which the shim system 7, as the entirety of all shim elements 6, has no structural components, and the positioning element 5 also serves as a holder of the shim elements 6 and can assume further the aforementioned functions, are also conceivable.

The superconducting magnet 1 is normally arranged within the vacuum vessel 8 in a helium vessel 2 of the cryostat that is filled with liquid helium during operation, wherein the helium vessel 2 is preferably radially surrounded by a nitrogen vessel 9 of the cryostat that is filled with liquid nitrogen. The cryostat may also comprise a cryocooler, by means of which the superconducting magnet 1 can be cooled to its operating temperature.

Preferably, the length of the path portion, provided for attaching a regulating element, along the vacuum vessel 8 from the first mechanical connection point 11 to the second mechanical connection point 10; 12 and/or the length of the path portion, provided for attaching a regulating element, along the positioning element 5 from the second mechanical connection point 10; 12 to the shim system 7 is in each case more than 50% of the overall length of the corresponding path.

In FIG. 1, the positioning element 5 comprises a clamping ring, the contact surface of which forms the second mechanical connection point 10 on the upper end of the room-temperature bore of the vacuum vessel 8.

Figure 2:
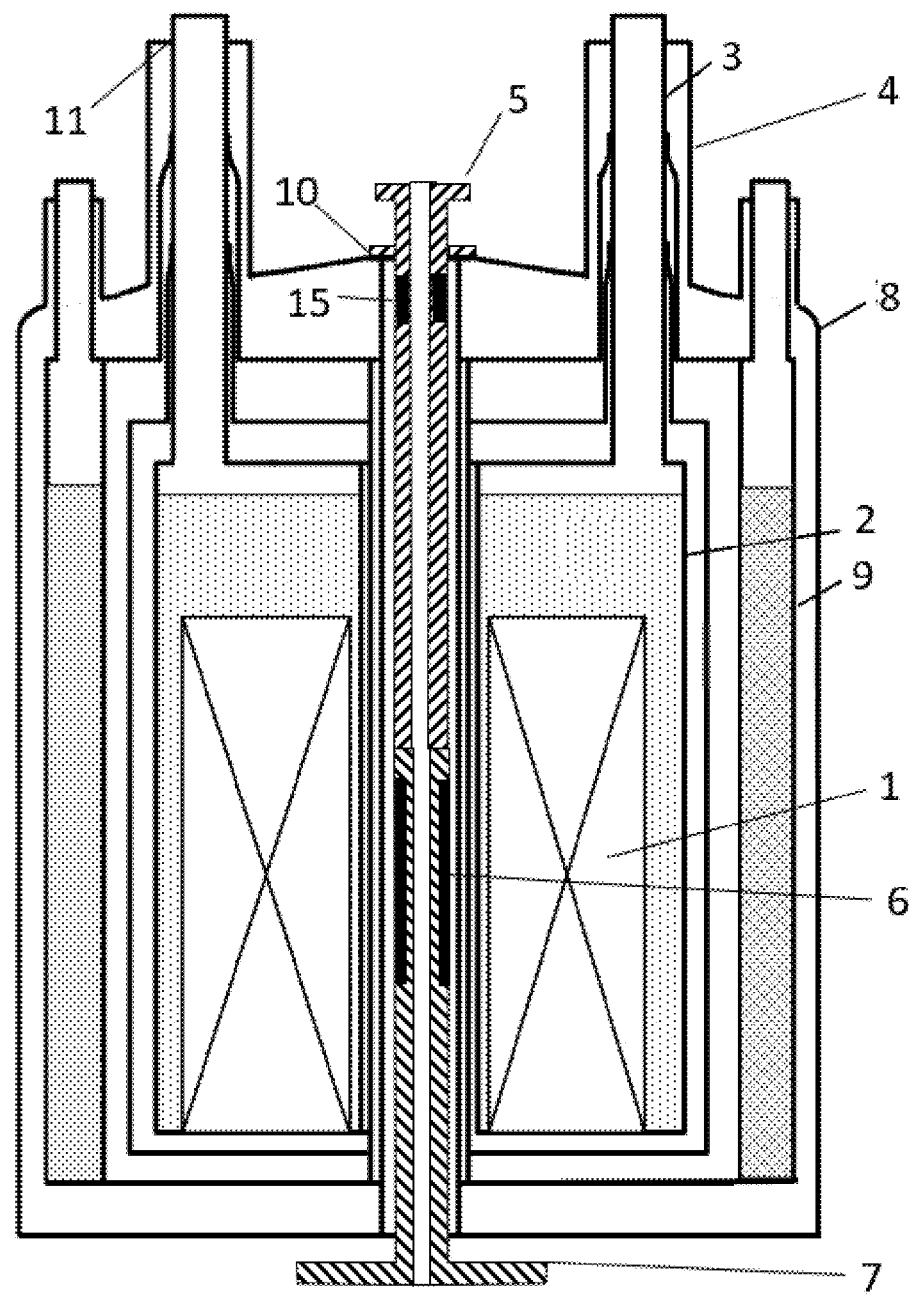
FIG. 2 is a schematic vertical section through an embodiment of the NMR apparatus according to the invention similar to that in FIG. 1, but with a mechanical actuator arranged in the path along the positioning element from the second mechanical connection point to the shim system.

FIG. 2 shows an embodiment of the NMR apparatus like that in FIG. 1, but additionally with a mechanical actuator 15 arranged below the clamping ring 10.

As illustrated in FIG. 2, the mechanical actuator 15 can be integrated in the positioning element 5 and is preferably designed as a piezo element. If the position of the shim system 7 is to be changed, the piezo element can be supplied with a corresponding electrical voltage. The change in length of the piezo crystal is then proportional to the applied voltage, and negative voltages are also possible. With the thickness of a piezo stack in sandwich construction, the range of the possible shift can be adapted to the shift requirements.

Figure 3:
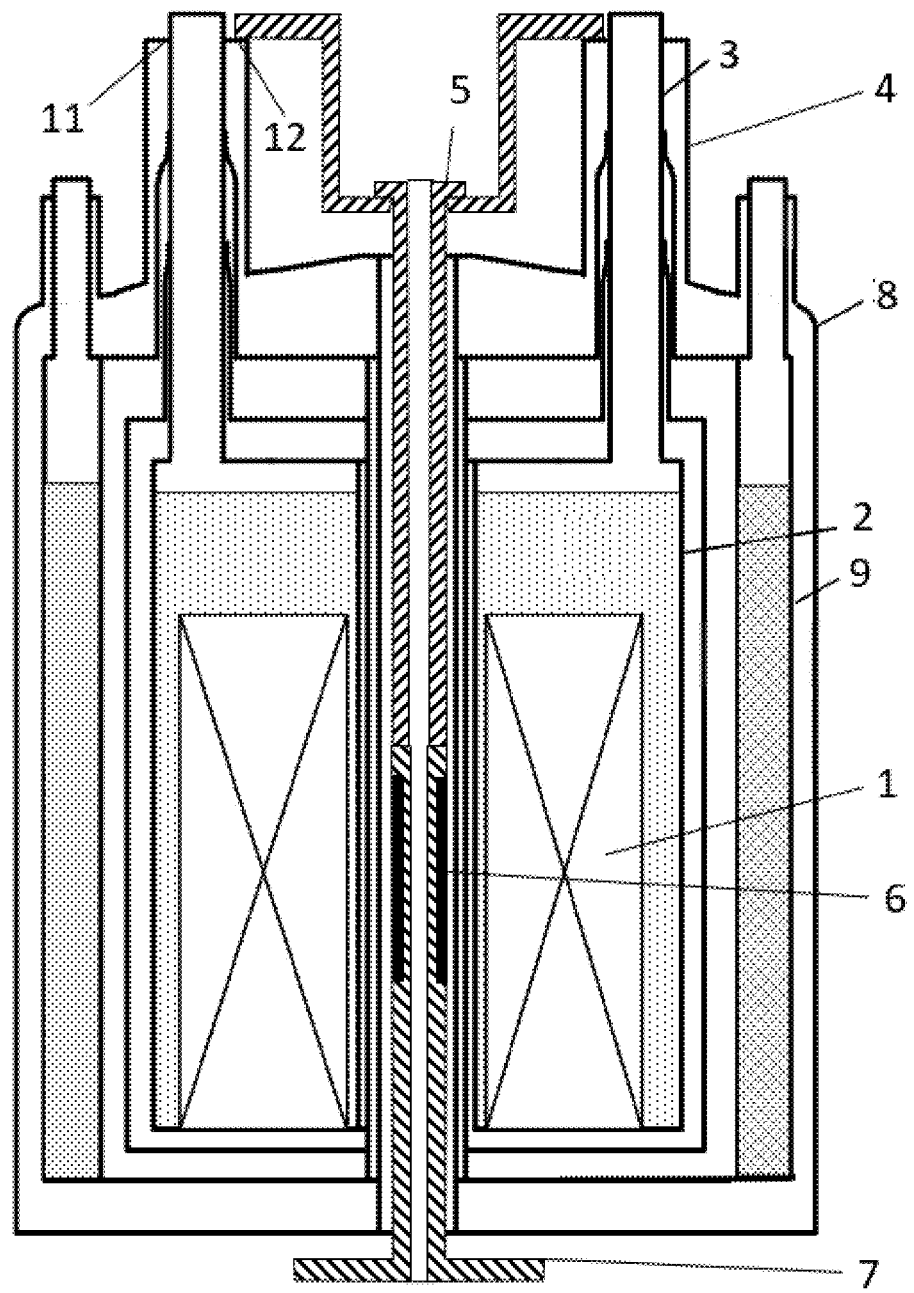
FIG. 3 is a further embodiment of the NMR apparatus according to the invention in which the positioning element comprises a scaffold, wherein the contact surface of the scaffold forms the second mechanical connection point on the upper end of the suspension turret of the magnet suspension.

FIG. 3 shows an alternative positioning element 5 with a scaffold which reaches to the upper end of the suspension turret 4 of the magnet suspension 3. The fastening point of the scaffold at the upper end of the suspension turret 4 forms the second mechanical connection point 12 between the positioning element 5 and the vacuum vessel 8. In this way, the first mechanical connection point 11 and the alternative second mechanical connection point 12 almost coincide on the vacuum vessel 8, and the path along the vacuum vessel 8 that connects the two mechanical connection points 11; 12 to one another is minimized. In particular, the scaffold can be produced from a material with a low thermal expansion coefficient so that no significant strains occur during temperature fluctuations.

Figure 4:
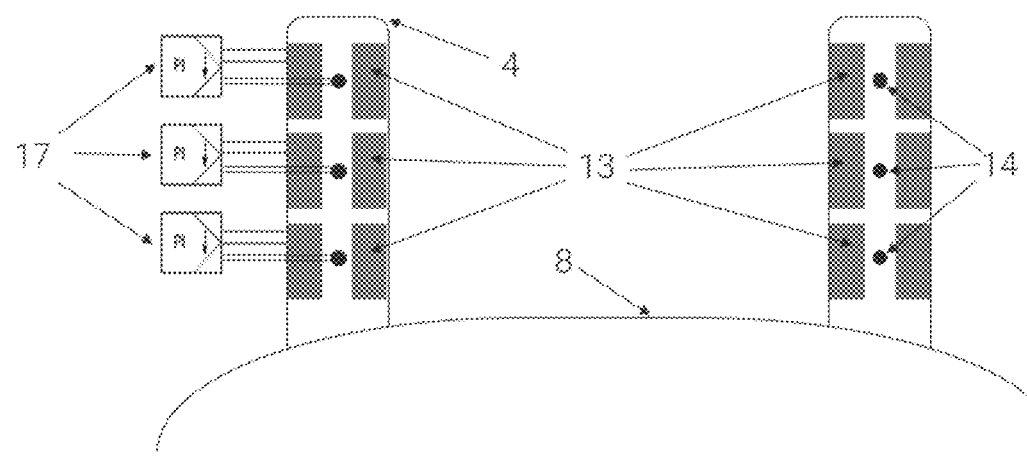
FIG. 4 is a detail of the NMR apparatus according to the invention, with the interconnection scheme for several regulating elements and sensor elements.

FIG. 4 shows a detail of the NMR apparatus according to the invention with the interconnection scheme for several regulating elements 13 and sensor elements 14, which are arranged on the suspension turrets 4. With the aid of the sensor elements 14, the strain or the temperature of the suspension turrets 4 is measured, and the measured strain change can be counteracted with the regulating elements 13. Several electronic control units 17 (here in the form of PI controllers) process the signals (control variable) of the sensor elements 14 and determine the output values (manipulated variable) for the regulating elements 13. The regulating elements 13 are designed here as heating elements. For example, PT-100 temperature sensors can be used as sensor elements 14. This embodiment illustrates how, with several control loops, the strain changes (controlled variable) can be kept small in portions on the different suspension turrets 4. With such a solution, maximum control of the strain is obtained. The effort required for this purpose is admittedly very large because several sensor elements 14, regulating elements 13 and electronic control units 17 are needed.

In control engineering, there are still many other controllers, which, however, shall not be discussed in detail here.

For a temperature measurement, PT-100 sensors are a good choice, since they are particularly sensitive in the room temperature range. Alternatively, other temperature sensors or strain measuring elements can be used. Heating elements usually comprise a meandering conductor track which covers as much area as possible.

Furthermore, FIG. 4 schematically indicates a current feed of the regulating elements 13 and of the sensor elements 14.

The suspension turrets 4 including the sensor elements 14 and the regulating elements 13 are usually covered with insulation material (which is, however, not shown specifically in the figure) in order to dampen fluctuations in the ambient temperature. In this example, the temperature of the suspension turrets 4 is artificially kept higher by the heaters than ambient temperature so that it is possible to react to elevations of the ambient temperature. Instead of the heating elements, cooling elements, in particular thermoelectric coolers (TEC), may also be used. In this case, the temperature of the suspension turrets 4 is, sensibly, kept lower than ambient temperature.

While an example with a plurality of PI controllers is shown in FIG. 4, it is also possible to reduce the number thereof by connecting several regulating elements 13 and several sensor elements 14 in series or in parallel in each case, wherein the control variables and manipulated variables are averaged by the controller. This often reduces the complexity and price of the required electronics, without great disadvantages.

Figure 5:
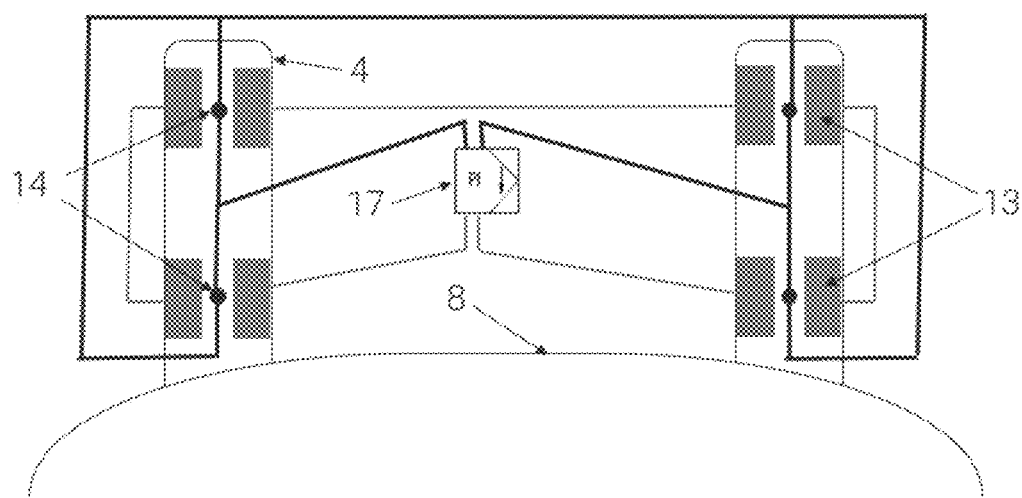
FIG. 5 is a detail of the NMR apparatus according to the invention, with the interconnection scheme for several regulating elements and sensor elements having only a single control loop.

Such an exemplary embodiment is shown in FIG. 5. However, the control over the strain of the suspension turrets 4 is somewhat less precise than in the exemplary embodiment according to FIG. 4. However, if a material with good thermal conductivity is used for the suspension turrets 4, the temperature gradient across the suspension turrets 4 can be reduced. Combined with good insulation of the suspension turrets 4 from the ambient temperature, strain regulation can be further improved.

Depending upon the application, there are a plethora of possibilities that can range between the two solutions presented here.

Similar arrangements as for the suspension turrets 4 are also possible for the positioning element 5.

Figure 6:
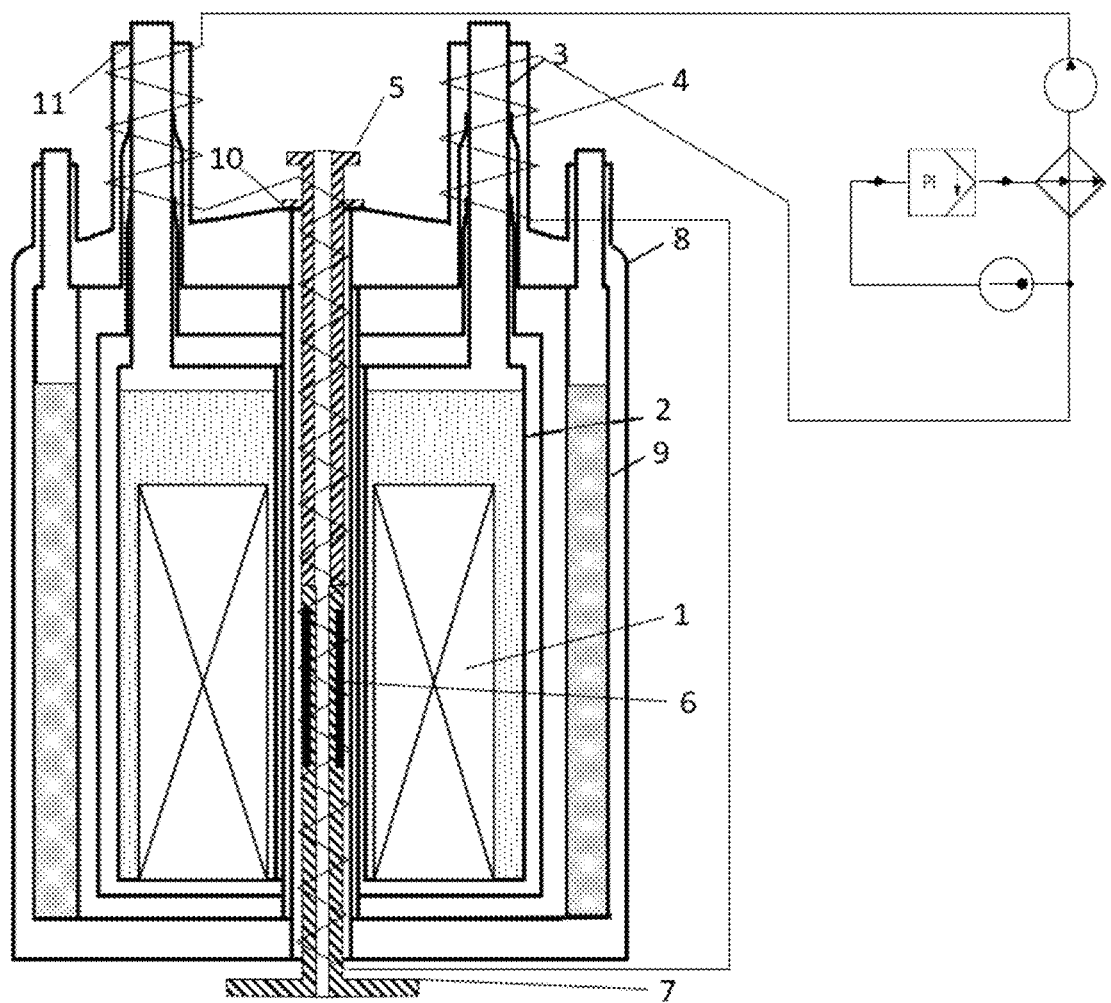
FIG. 6 is a schematic, vertical sectional view of an embodiment of the NMR apparatus according to the invention, with a temperature-controlled fluid which keeps the suspension turrets and the positioning element at a constant temperature.

FIG. 6 shows an embodiment with a liquid circuit, which is guided along the suspension turrets 4 and the positioning element 5. An advantage of this embodiment is that only a single, regulated heating element or cooling element is necessary for the temperature stabilization of several components. A temperature-control liquid can transport large amounts of heat, so that the temperature gradients within the temperature-controlled objects can be kept small. This improves the precision of the control of thermal expansion. With insulation from the exterior space, the temperature gradient within the temperature-controlled objects can be further reduced. A gas can also be used as the temperature-control fluid. The advantage of a gas is that it can be guided openly along the positioning element 5 within the magnet bore.

LIST OF REFERENCE SKINS

1 Superconducting magnet
2 Helium vessel
3 Magnet suspension
4 Suspension turrets
5 Positioning element of the shim system
6 Shim elements
7 Shim system
8 Vacuum vessel
9 Nitrogen vessel
10 Second mechanical connection point
11 First mechanical connection point
12 Alternative second mechanical connection point
13 Regulating element
14 Sensor element
15 Mechanical actuator
17 Electronic control unit

The invention claimed is:

1. An NMR apparatus having a magnet coil system for generating a homogeneous magnetic field, the apparatus comprising:
   a superconducting magnet arranged within a vacuum vessel in the cold region of a cryostat,
   a shim system containing shim elements arranged outside the vacuum vessel,
   a magnet suspension via which the superconducting magnet has a first mechanical connection point to the vacuum vessel,
   a positioning element via which the shim system has a second mechanical connection point to the vacuum vessel, and
   at least one regulating element located on a portion of a first path along the vacuum vessel from the first mechanical connection point to the second mechanical connection point and/or on a portion of a second path along the positioning element from the second mechanical connection point to the shim system, the at least one regulating element adjusting a strain of the vacuum vessel and/or a strain of the positioning element along the path portion on which it is located.

2. The NMR apparatus according to claim 1, wherein the regulating element comprises a temperature control element and/or a heat exchanger for transferring heat to or from a temperature-controlled fluid.

3. The NMR apparatus according to claim 2, wherein the temperature control element comprises one of a heating element and a cooling element.

4. The NMR apparatus according to claim 3, wherein the temperature control element comprises an electrical resistance heater.

5. The NMR apparatus according to claim 3, wherein the temperature control element comprises a thermoelectric cooler.

6. The NMR apparatus according to claim 1, wherein the at least one regulating element comprises at least one actuator by means of which the strain of the vacuum vessel and/or the strain of the positioning element along the path portion on which the at least one regulating element is located, and/or a position of the positioning element relative to the vacuum vessel, can be adjusted.

7. The NMR apparatus according to claim 1, further comprising a sensor element located on a portion of the first path and/or on a portion of the second path, the sensor element measuring the strain and/or a temperature of the vacuum vessel and/or of the positioning element along the path portion on which it is located.

8. The NMR apparatus according to claim 7, wherein the sensor element comprises a thermometer.

9. The NMR apparatus according to claim 8 wherein the sensor element comprises a PT-100 sensor.

10. The NMR apparatus according to claim 7, wherein the sensor element comprises a strain measuring element.

11. The NMR apparatus according to claim 10, wherein the sensor element comprises an optical strain sensor.

12. The NMR apparatus according to claim 7, wherein the regulating element is located on a portion of the first path and/or on a portion of the second path, and the sensor element is at a different location.

13. The NMR apparatus according to claim 1, wherein a thermal insulation is attached to a portion of the first path or the second path.

14. The NMR apparatus according to claim 1, wherein the vacuum vessel has a vertical room-temperature bore in which the shim system is arranged, and wherein the positioning element comprises a clamping ring with a contact surface that forms the second mechanical connection point on an upper end of the room-temperature bore.

15. The NMR apparatus according to claim 1, wherein, on the first path or the second path, materials with different thermal expansion coefficients whose thermal expansions mutually compensate for one another are used.

16. The NMR apparatus according to claim 1, wherein, on at least one portion of the first path and/or on at least one portion of the second path, only materials whose thermal expansion coefficient at operating temperature is less than 5 ppm/K are used.

17. The NMR apparatus according to claim 1, wherein the superconducting magnet is located in a helium vessel of the cryostat that is filled with liquid helium during operation.

18. A method for operating the NMR apparatus according to claim 1, comprising measuring, on a portion of the first path and/or on a portion of the second path, the temperature and/or the strain of the vacuum vessel and/or of the positioning element by means of a sensor element, and stabilizing said temperature and/or strain of the vacuum vessel over time using an electronic control unit that actuates the regulating element.

19. A method for operating the NMR apparatus according to claim 1, comprising detecting a temperature or strain change at a location of at least one of said path portions by means of a sensor element, and counteracting the detected temperature or strain change using a control unit that actuates the regulating element positioned at a location different than said location of the at least one of said path portions.

20. A method for operating the NMR apparatus according to claim 1 comprising measuring the temperature and/or strain of the vacuum vessel and/or of the positioning element on a portion of the first path and/or on a portion of the second path by means of a sensor element, and adapting currents through the shim elements of the shim system using an electronic control unit such that a change in a homogeneity of the magnetic field due to the measured temperature and/or strain changes is counteracted such that the field homogeneity is stabilized over time.

* * * * *